United States Patent [19]

Tavernetti et al.

[11] Patent Number: 5,043,666

[45] Date of Patent: Aug. 27, 1991

[54] SELF-CALIBRATING ELECTROMAGNETIC FIELD SENSOR FOR LOCATING BURIED CONDUITS

[75] Inventors: Russell E. Tavernetti, San Carlos; Paul W. Dodd, San Jose, both of Calif.

[73] Assignee: Metrotech Corporation, Mountain View, Calif.

[21] Appl. No.: 509,526

[22] Filed: Apr. 16, 1990

[51] Int. Cl.5 .............. G01V 3/11; G01V 3/165; G01R 19/00; G01R 35/00
[52] U.S. Cl. .................... 324/326; 324/202
[58] Field of Search ............. 324/67, 202, 207.26, 324/326, 329

[56] References Cited

U.S. PATENT DOCUMENTS

| | | | |
|---|---|---|---|
| 3,471,772 | 10/1969 | Smith | 324/329 |
| 3,826,973 | 7/1974 | Pflaum | 324/329 |
| 4,387,340 | 6/1983 | Peterman | 324/326 |
| 4,639,666 | 1/1987 | Strosser et al. | 324/202 |

FOREIGN PATENT DOCUMENTS 2006438  5/1979  United Kingdom ............ 324/326
2070783  9/1981  United Kingdom ............ 324/326

Primary Examiner—Gerard R. Strecker
Attorney, Agent, or Firm—Rosenblum, Parish & Bacigalupi

[57] ABSTRACT

An electromagnetic field sensing apparatus used for locating and determining the distance to buried conductive conduits including at least two receptor means, each adapted to receive a signal from the conduit and produce an output voltage proportional to the signal received, and also including a calibrating coil, with known relative coupling to the receptor means, and capable of inducing calibrating signals therein. Computing means are employed to calculate the relative sensitivities of each said receptor means using the voltage signals induced therein by the calibrating coil, and said known relative coupling relationships. The computing means further uses the output voltages from said receptor means, induced therein by the signal radiating from the conductive conduit, and said relative sensitivities to calculate the distance to and location of the conduit. Display means are provided to indicate this distance and location.

9 Claims, 7 Drawing Sheets

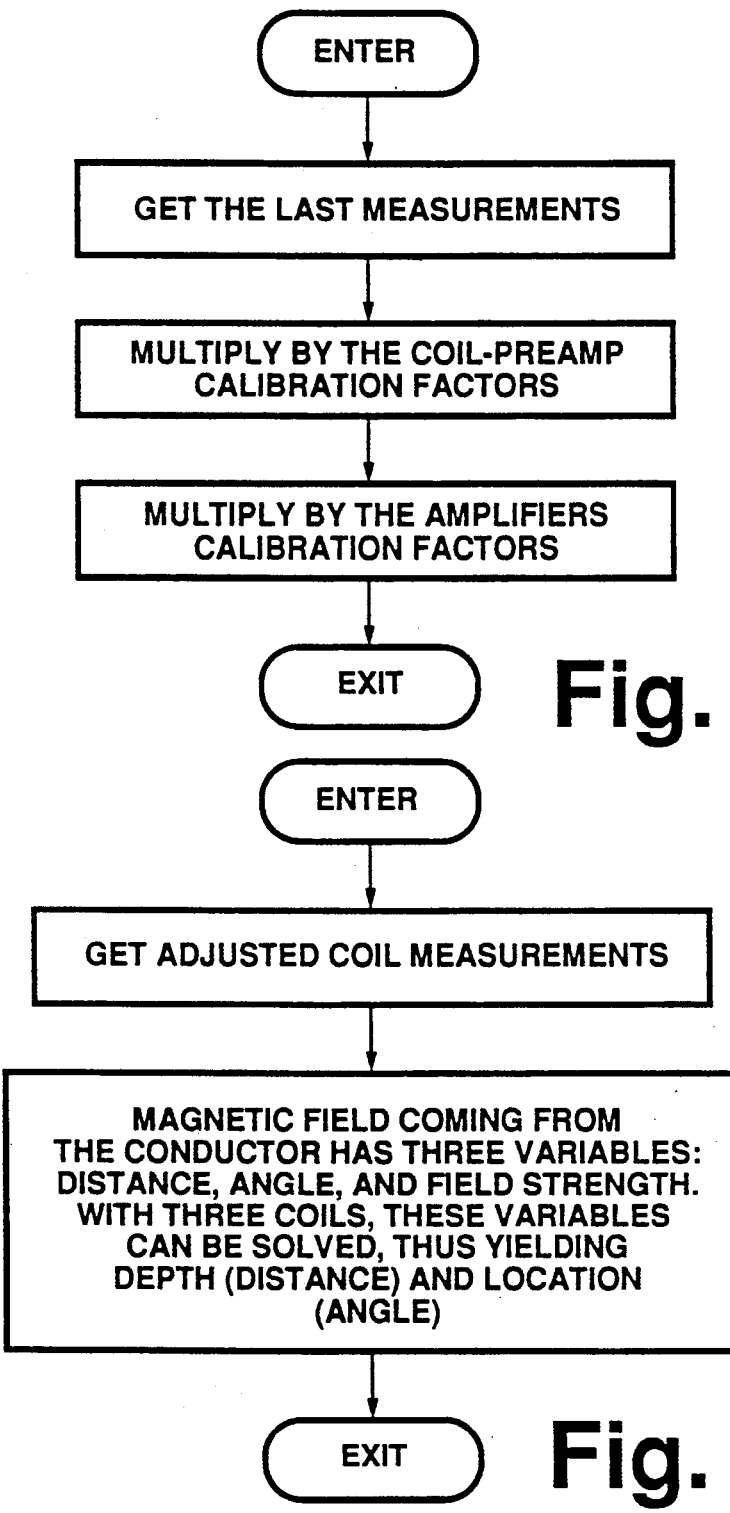

SELF-CALIBRATING ELECTROMAGNETIC FIELD SENSOR FOR LOCATING BURIED CONDUITS

BACKGROUND OF THE INVENTION

1. Field of the Invention

The present invention relates generally to a device for determining the location and distance to a conductive conduit, and more particularly, it relates to an internally self-calibrating apparatus for determining highly accurate depth measurements of a concealed conductor, such as an underground pipe or cable, which is radiating an electromagnetic signal.

2. General Description of Prior Art

There are a number of devices available to determine the location and depth of electrically conductive structures, the most apparent application of such device being its use in finding underground cables and pipes. Throughout the evolution of these electronic devices, much attention has been given to the simplification of the design and user operability. Thus, more and more emphasis has been shifted to designing these sensory devices with internalized functions, obviating the need for user interface, and resulting in increased overall accuracy in measurements performed by the instrument.

Most electromagnetic-sensor depth-finding devices make use of receiving coils or antenna positioned so that their axes are parallel to the horizontal plane of the ground. These coils or antenna are sensitive to electromagnetic fields which can be made to radiate from a concealed source by direct application of an alternating current to the source, or by inductive coupling of this current with the source. Using the difference in field strength sensed between two vertically displaced receptors, the sensing devices are capable of determining the depth of the radiating source.

A good example of an earlier sensing device is described in the November 1965 issue of the BELL LABORATORIES RECORD. To calculate the depth measurements by use of this device, the operator first activates a lower receiving coil or antenna. The signal received by this receptor is amplified to a useful output level, and then a read-out meter is manually adjusted to use this output level as representative of a full scale signal response. Next, the lower receptor is disconnected, and the upper coil or antenna activated. The signal received from this receptor is amplified and sent to the previously adjusted meter, which is calibrated to reflect the ratio of the signals from the two receptors as a user-readable depth measurement. Although this device is effective when used properly, there is significant room for user error due to the necessity of manual adjustments and meter readings. Additionally, periodic calibration of the instrument is necessary to insure that the highly sensitive receiving coils are performing accurately.

Another device, described in U.S. Pat. No. 4,387,340 and related U.S. Pat. No. 4,520,317, significantly alleviated the possibility for user error by internalizing the sensor functions. This device uses a similar upper and lower coil arrangement as that used in earlier sensing devices, however, this device also employs two additional receiving coils. The additional coils are placed laterally apart, and equidistant from and perpendicular to a vertical line extending between the upper and lower coils. These laterally placed coils are used to determine the exact horizontal location of the radiating source, and thus increase the accuracy of any subsequent depth measurements. A sequencer controller was also introduced in this device which insures the automatic process of measuring the signal received by the bottom sensor, storing it in memory, holding the value of the gain for the amplification means, and amplifying the signal received by the top sensor using this stored value of gain. A computing means then calculates the depth of the radiating object based upon the amplified output voltages from the upper and lower receiving coils. This depth calculation is then displayed by a user-readable display means.

Although this device eliminates many of the manual steps that were once necessary, the circuitry involved is still very sensitive and complex. In all electromagnetic field sensing devices, very precise measurements must be made with the receiving coils. These measurements necessarily depend upon the relative accuracy and stability of the receiving coils and associated circuitry. In earlier devices, it was necessary to sacrifice sensitivity to very small signals in order to improve relative accuracy and stability. Additionally, the earlier devices operated in an open-loop fashion, necessitating periodic manual re-calibration, to assure that the receiving coils were providing accurate field readings. This allowed for error in measurements performed in between this re-calibration, and the inconvenience of periodic manual system adjustments.

SUMMARY OF THE PRESENT INVENTION

An object of the present invention is to provide an improved conductive conduit and electrical conductor locating apparatus which is internally self-calibrating, thus eliminating the need for manual calibration adjustments such as those required in an open-loop system.

It is also an object of the present invention to provide an apparatus of the type described wherein the accuracy and stability necessary in the device is retained without the previously associated sacrifice of locator sensitivity, especially to small input signal levels.

A further object of the present invention is to provide an apparatus of the type described wherein both vertical and horizontal locator functions are implemented without the need for a fourth vertical gradient coil, thus simplifying the hardware requirements and reducing the costs of manufacture.

It is a still further object of the present invention to provide a physical embodiment of an apparatus of the type described which is variably configurable such that the space occupied by the device is minimized, allowing for easy storage and transportation, and the comfort and convenience of its operation is maximized.

In order to achieve the above objects of the present invention, a preferred embodiment employs three receiving coils, each adapted to receive a signal transmitted from a buried conductor or the like, and to provide an output voltage proportional to the strength of the signal received. The three receiving coils are situated such that an upper coil is placed in the device and lies along a line perpendicular to a line joining the two lower coils, which are situated horizontally a fixed distance apart. The two lower coils function, in part, to provide a horizontal displacement reading to the device operator, enabling the operator to precisely locate the buried conduit, and subsequently perform any depth measurements with a high level of accuracy. Means are employed to combine the signals generated by the bottom receiving coils in a vector fashion, yielding a signal corresponding to the transmitted field strength which exists at a point midway between the two lower coils and below the upper coil, thus eliminating the need for a fourth vertical gradient coil. Hence, the two lower coils also function, in part, in conjunction with the upper coil to provide precise depth measurements.

A calibrating coil, with known relative coupling to the receiving coils, is placed in a known position near the receiving coils, so as to be capable of simultaneously inducing calibrating signals in all three. Microprocessor control means are employed to periodically provide for transmission of a calibrating signal from the calibrating coil, which enables the relative sensitivities of the receiving coils to be measured, stored, and relative sensitivity factors for each coil to be generated for use in subsequent measurements. Since this calibration is ongoing, and microprocessor controlled, accuracy of the measurements performed by this apparatus is greatly increased, with little room for human error, no need for periodic manual calibration, and no limitations due to external factors, which may effect coil performance, such as temperature. Additionally, since the calibrating coil can be made to transmit small signals to the receiving coils, coil sensitivities at small input signal levels can be determined. This provides the apparatus with the ability to accurately measure small signals and, hence, small signal measurements no longer need to be sacrificed.

BRIEF DESCRIPTION OF THE DRAWINGS

FIG. 3e is a flow chart elaborating the step depicted in block "e", shown in FIG. 3.

FIG. 3f is a flow chart elaborating the step depicted in block "f", shown in FIG. 3.

DETAILED DESCRIPTION OF THE PREFERRED EMBODIMENT

Figure 1:
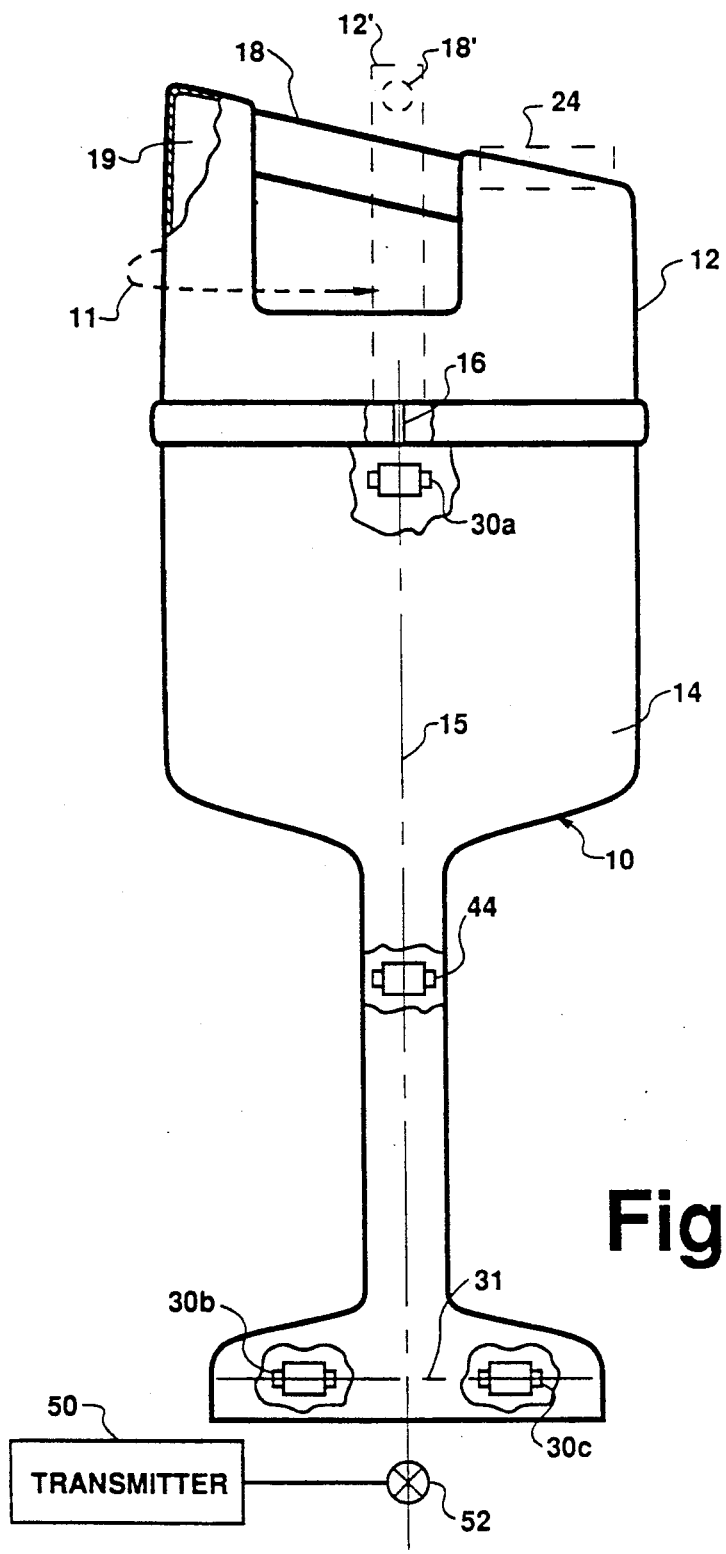
FIG. 1 is an elevational view of the preferred embodiment of the present invention.

Referring to FIG. 1, an elevational view of a preferred embodiment of the present invention is shown. The apparatus comprises an outer housing 10 formed by an upper casing 12 connected to a lower casing 14 by means of a pivoting joint 16 disposed along a vertical axis 15 passing through the center of the housing 10. The joint 16 allows the top casing to be rotated into an operational position oriented 90 degrees with respect to the lower casing 14. The upper casing 12 includes a handle 18, a battery compartment 19, and a control panel 24 for providing the user with sensor controls and displays. The lower casing 14 includes a top receiving coil 30a, disposed within the housing 10 and along axis 15, and a left lower receiving coil 30b and a right lower receiving coil 30c within and disposed at the bottom of housing 10 on opposite sides of axis 15. Each receiving coil is capable of receiving an electromagnetic signal and producing an output voltage proportional to the strength of the signal received. The relationship between the top receiving coil 30a and the left and right lower receiving coils 30b and 30c is such that the axis 15 passing through the top receiving coil 30a intersects the midsection of a line 31 extending between the lower receiving coils 30b and 30c, and is substantially perpendicular thereto.

Also included in the lower casing 14 is a calibrating coil 44 capable of radiating an electromagnetic calibrating signal of selectable intensity. The calibrating coil 44 is located a selected distance below the top receiving coil 30a and above the lower receiving coils 30b and 30c, and lies along axis 15. Additionally, the electronic circuitry shown in the schematic diagram in FIG. 2 is included in the lower casing 14.

A novel feature of the preferred embodiment is the capability of the upper casing 12 to be pivoted by 90 degrees with respect to the lower casing 14, as suggested by the dashed arrow 11, such that, in operation, the upper casing is positioned in a manner as illustrated by the dashed line 12'. This allows the operator to use the apparatus in a natural and comfortable position with the horizontal axis of handle 18 extending forward, as illustrated by dashed line 18', and the lower receiving coils 30b and 30c extending to the operator's right and left. Additionally, the control panel 24 can be easily read while the apparatus is in this position. The elevational view of FIG. 1 portrays the apparatus 10 in its non-operational storage position whereby said apparatus is essentially flat.

Also shown in FIG. 1 is a transmitter 50 capable of inducing an electrical signal in a cable 52, or other like conductive object. Although not forming an integral part of the preferred embodiment, this transmitter 50 is used to impress a signal, either by direct electrical connection or other types of coupling, upon the cable 52, causing the cable to radiate an electromagnetic field. This electromagnetic field can then be detected by the apparatus of the present invention, and the depth and location of the radiating cable can be determined.

Figure 2:
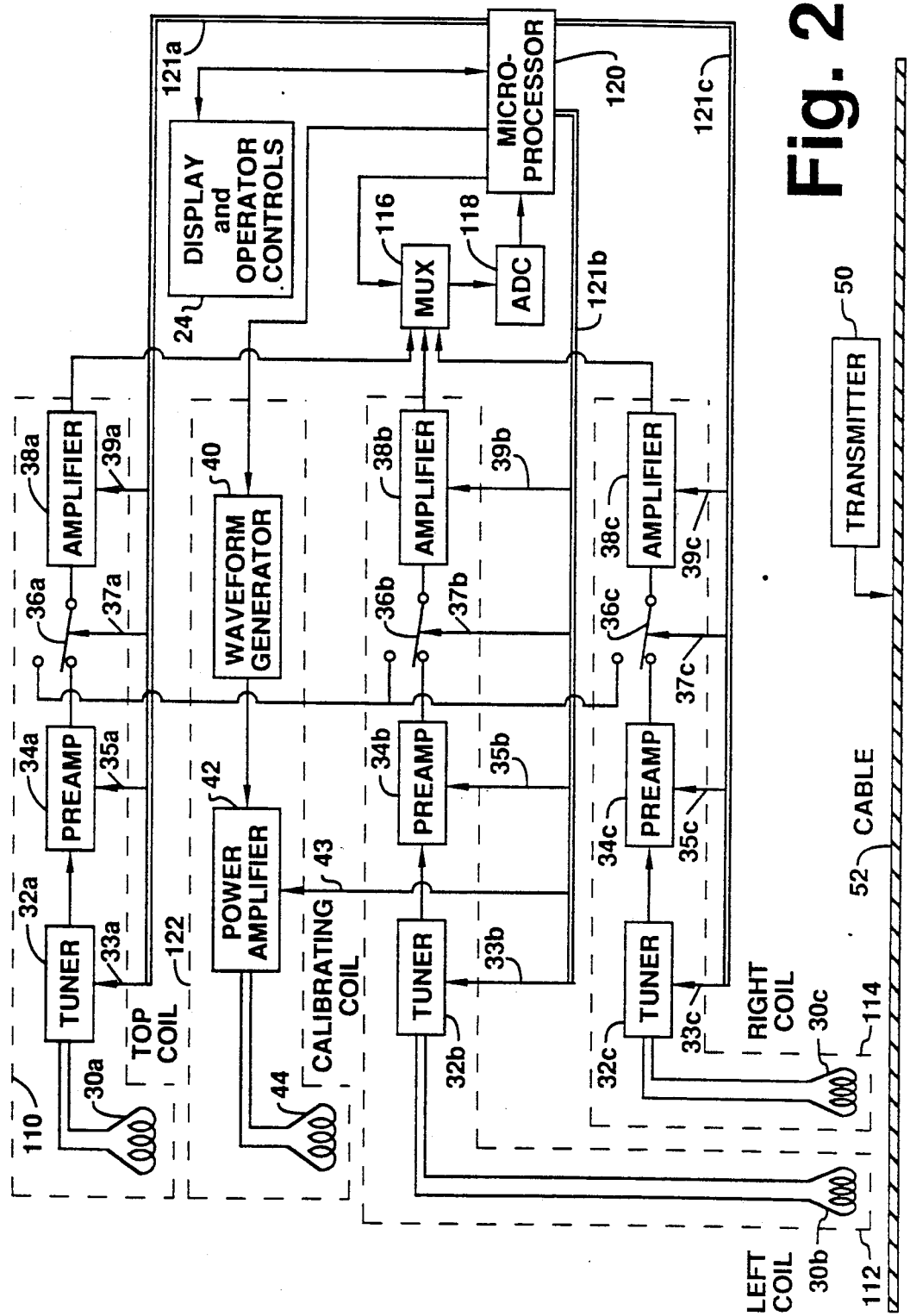
FIG. 2 is a schematic block diagram showing the principle functional components of the preferred embodiment.

Referring now to FIG. 2, the preferred embodiment comprises three electromagnetic field intensity sensing subsystems 110, 112, and 114, each of which is capable of producing an electrical output proportional to the intensity of a detected input electromagnetic field signal. Outputs from the three subsystems are separately transmitted to the input of a multiplexer 116, which sequentially samples this input data and transmits an output to the input of an analog-to-digital converter 118. The analog-to-digital converter 118 transforms the analog signals from the multiplexer 116 into a digital format, and transmits the digital signals to the input of a microprocessor 120. In addition to processing the input digital signals, the microprocessor 120 also controls a calibrating electromagnetic field generating subsystem 122, which is capable of radiating electromagnetic energy at selected intensity levels, which in turn induce signals in the subsystems 110, 112, and 114.

The three field sensing subsystems 110, 112, and 114 are designed and implemented in an identical manner. A detailed description of all three is, therefore, unnecessary, and the following detailed description of subsystem 110 is equally applicable to subsystems 112 and 114.

Reference to the similar elements of each of the subsystem will be differentiated by the addition of the lower case letters a, b, and c, respectively.

Subsystem 110 comprises the receiving pickup or antenna coil 30a oriented such that, when in use, its winding axis is substantially horizontal, and capable of receiving signals from the radiating source 52. Coil 30a is coupled to the input of a tuner 32a which provides the device operator with capability to narrowly tune reception of the receiving coil 30a to desired frequencies. This reduces signal interference and noise which is characteristic of an untuned or broadly tuned circuit. Tuner 32a is responsive to control signals generated by the microprocessor 120 and communicated by means of a bus 21 to an input 33a. The tuned output is input to a preamp 34a, which provides preamplification of the input signal. The preamp 34a is responsive to a control input received from the microprocessor 120 via the bus 121 and an input lead 35a, and is switchable between at least two gain settings. The output of the preamp 34a is connected to the input of an amplifier 38a by means of a switch 36a, and provides an amplified output signal to the input of the multiplexer 116. The gain of amplifier 38a is selectable under control of the microprocessor 120 by signals communicated over the bus 121 and the input lead 39a.

Although FIG. 2 shows separate buses 121a, 121b, and 121c from the microprocessor 120, it is contemplated that a common bus may be used to provide control of each of the switches 36a, 36b and 36c, as well as each of the other elements of the subsystems 110, 112, and 114.

In the preferred embodiment, each amplifier 38a, 38b, or 38c, acts in conjunction with its preamp 34a, 34b or 34c, to provide a total amplification gain range from 0 to 108 decibels. More specifically, the preamps 34a, 34b, and 34c are capable of providing a selected preamplification gain level of either 0 dB or 54 dB. Similarly, the amplifiers 38a, 38b, and 38c are capable of providing a selected gain of 0 to 54 dB in six-dB steps. Accordingly, amplification of 54 dB or less is provided by the amplifiers 38a, 38b, and 38c, with the preamplification gain maintained at 0 dB. When signal amplification greater than 54 dB is required, the preamplification gains are set at 54 dB, and the amplifiers provide additional gain in six-dB steps up to the maximum combined preamplification and amplification gain of 108 dB.

The switches 36a, 36b, and 36c are either actually or effectively ganged together and responsive to control by the microprocessor 120. Inputs applied at 37a, 37b and 37c to the switches 36a, 36b, and 36c, respectively, cause all switches to simultaneously be in either their upper or lower contact positions. The switches are designed to allow selective connection of all of the amplifiers 38a, 38b and 38c, to a common preamp, namely, preamp 34a, so that each of the respective amplifiers can be calibrated without the influence of different preamp signals. By using a common preamplified signal, it is possible to separately calculate calibration factors for each amplifier. These calibration factors can be used in subsequent measurements, thus eliminating possible errors in signal measurements due to characteristics unique to the amplifiers 38a, 38b and 38c, and consequently providing for greater instrument accuracy.

Also shown in FIG. 2 is the electromagnetic field generating subsystem 122, the purpose of which is to provide calibration of the receiving coils 30a, 30b and 30c, and their associated preamps. The electromagnetic field generating subsystem comprises a waveform generator 40 which is responsive to input from the microprocessor 120 and operative to produce an AC signal at a selected frequency. The output from the waveform generator 40 is supplied to the input of a power amplifier 42, the gain of which is also controlled by the microprocessor 120 applied at an input 43. Output from the power amplifier 42 is coupled into a calibrating coil 44 which radiates a calibrating electromagnetic field signal to the receiving coils 30a, 30b and 30c.

The calibrating coil 44 is oriented so that, when in use, its winding axis is, like the axes of coils 30a, 30b and 30c, substantially horizontal, and is placed at fixed distances from each of the receiving coils. As shown in FIG. 1, the calibrating coil 44 is positioned between the top receiving coil 30a and the bottom receiving coils 30b and 30c, such that it lies on a line between the top coil 30a and the midpoint of a line between the bottom coils 30b and 30c. The calibrating coil 44 has known relative coupling with each of the receiving coils 30a, 30b, and 30c. Under control of the microprocessor 120, a signal of known intensity can be made to radiate from the coil 44. Normally, the microprocessor 120 sets the signal level to be radiated from the coil 44 at the same initial signal level as the ambient signal level received by the lower receiving coils 30b and 30c. This assures that calibration will be achieved at a signal level which is in the same range of signals to be detected in subsequent measurements.

By measuring the difference between the background signal alone, as detected by the receiving coils 30a, 30b, and 30c, and the background signal together with the signal induced by the calibrating coil 44, as detected by the receiving coils, the component of the received signal due to the induced calibrating signal can be determined. Computing means employed in the microprocessor 120 then calculate relative sensitivity factors of the receiving coils 30a, 30b, and 30c, using the known relative coupling relationship between each receiving coil and the calibrating coil 44. These factors are then applied to subsequent measurements to correct for any deviations in the sensitivities of the receiving coils 30a, 30b, and 30c at a given signal level. Thus, the apparatus operates in a closed-loop fashion, supplying the necessary receiving coil calibration automatically. This assures proper instrument operation regardless of external conditions such as temperature, which can sometimes effect the accuracy of the sensitive coils and associated circuitry, and also obviates the need for the periodic manual calibration inherent in prior devices.

Additionally, because the receiving coils 30a, 30b and 30c can be calibrated using small signal levels from the calibrating coil 44, sensitivity factors for the receiving coils at this small signal level can be calculated and employed in subsequent measurements. This allows accurate measurements at small background signal levels, something that was sacrificed in earlier sensing devices.

A further feature of the present invention is the use of only three signal-receiving coils 30a, 30b, and 30c, rather than the four receiving coils required in prior sensing devices with similar measurement capabilities. Signals received by the bottom receiving coils 30b and 30c are combined by the microprocessor 120 in vector fashion to produce a resultant signal which represents the field strength existing between the receiving coils 30b and 30c, and directly beneath the top receiving coil 30a. Depth calculations are then made by the microprocessor using the difference between the signal received by the top receiving coil 30a and the resultant signal produced by the vector combination of the output from the left receiving coil 30b and the right receiving coil 30c. This left and right coil combination thus takes the place of a fourth vertical gradient coil required by prior art to be placed beneath the top receiving coil.

Thus, the bottom receiving coils 30b and 30c serve a dual purpose. They are used to determine lateral direction to the conductive object 52, and they are used in combination with the top receiving coil 30a to determine the vertical distance, or depth, to the conductive object 52. The elimination of a fourth coil simplifies the hardware requirements of the apparatus and reduces the costs of manufacture. Thus, the practical advantages of this new innovation over prior sensing devices are readily apparent.

Figure 3:
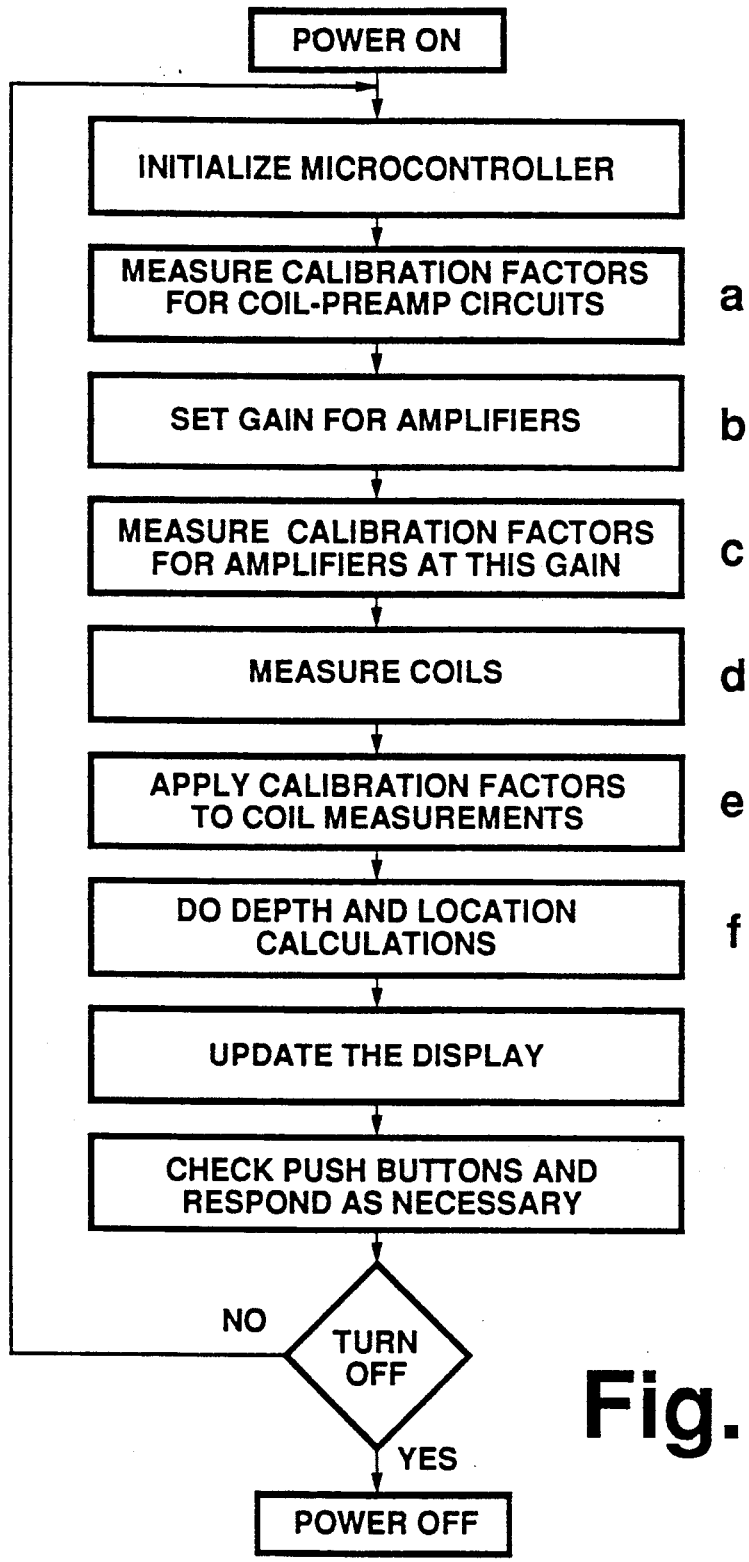
FIG. 3 is a flow chart illustrating the use sequence of the present invention including calibration, measurement, and depth and location calculation.

FIG. 3 and FIGS. 3a-3f are flow charts detailing the various steps followed by the apparatus in order to produce the desired depth location measurement. As shown in FIG. 3, the operator turns the sensor power on and initializes the microprocessor 120. The microprocessor initially determines the level at which to set the calibrating coil 44 by using the last measured background signal level received from the left receiving coil 30b and the right receiving coil 30c, as described above.

Figure 3A:
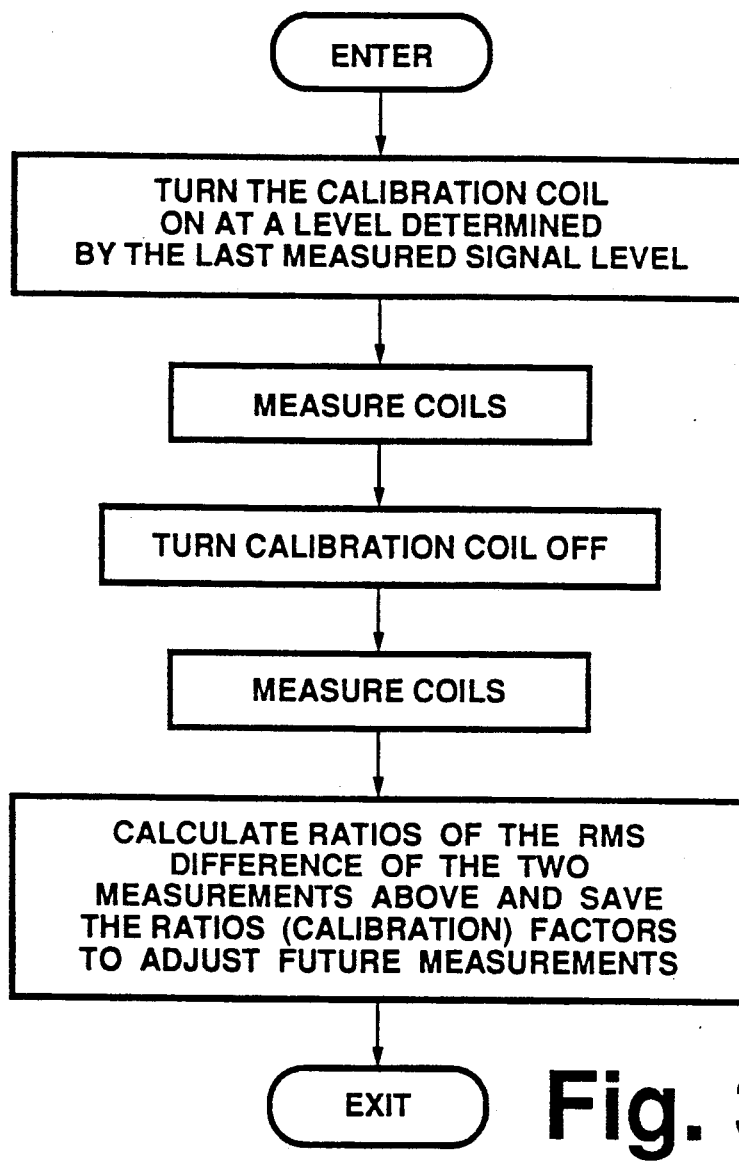
FIG. 3a is a flow chart elaborating the step depicted by block "a", shown in FIG. 3.

As further detailed in FIG. 3a, once the microprocessor determines the signal level at which to set the calibrating coil 44, the calibrating coil is energized, and the outputs of each signal receiving coil, 30a, 30b and 30c are individually measured. The calibrating coil is then de-energized, and the outputs of each of the receiving coils 30a, 30b, and 30c are once again measured. The microprocessor then uses this measurement information, and the known relative coupling coefficients of the receiving coils 30a, 30b, and 30c to calculate the relative sensitivity factors of these receiving coils. These factors are then stored by the microprocessor for use in adjusting subsequent measurements.

Figure 3B:
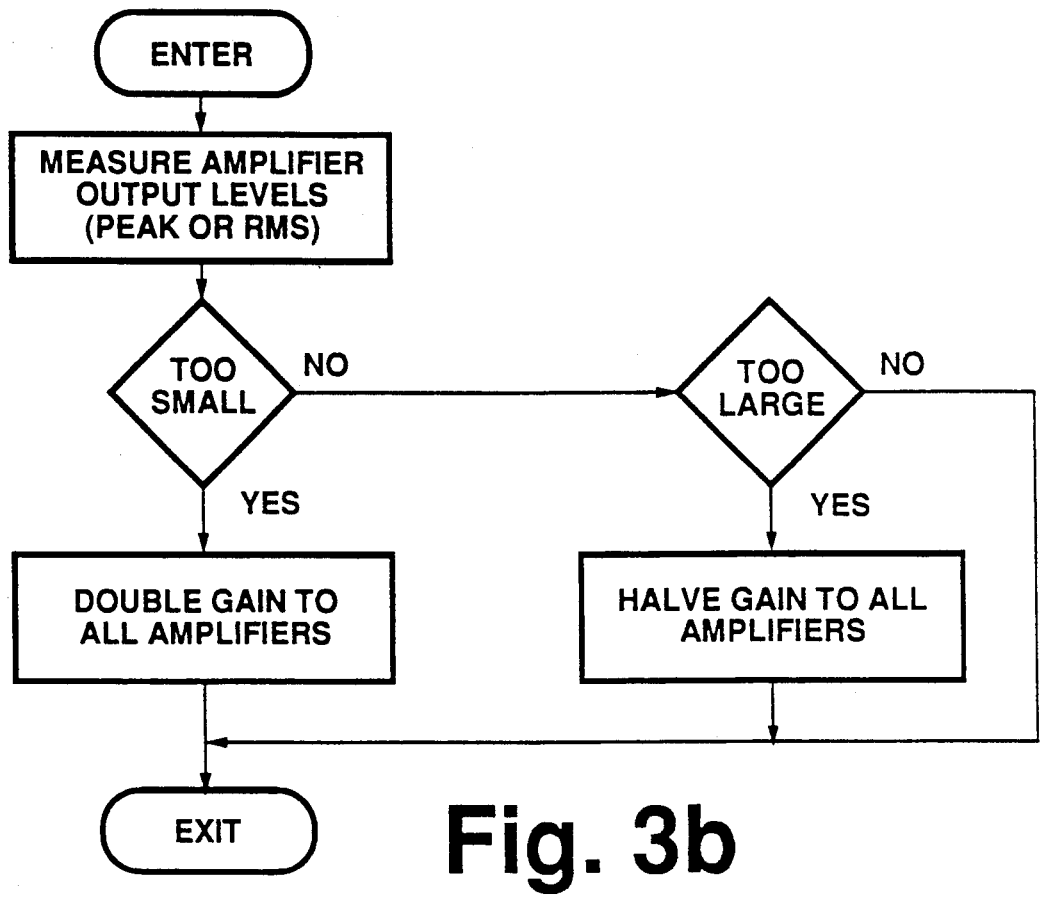
FIG. 3b is a flow chart elaborating the step depicted by block "b", shown in FIG. 3.

Next, as shown in FIG. 3b, the gain is set for each of the amplifiers 38a, 38b, and 38c. This is a straight-forward process in which the amplifier output level is measured and adjusted by the microprocessor 120 in order to achieve an operational output gain level. In this embodiment, the amplifiers 38a, 38b, and 38c have a range of 0 to 54 dB, selectable in six-dB steps, and are used in conjunction with the preamplifiers 34a, 34b, and 34c, respectively, as previously described.

Figure 3C:
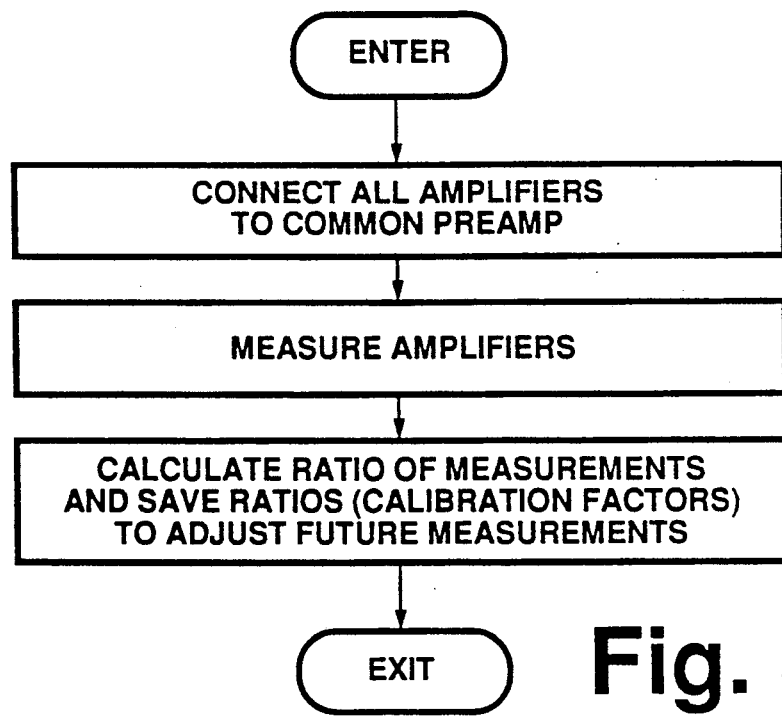
FIG. 3c is a flow chart elaborating the step depicted in block "c", shown in FIG. 3.

FIG. 3c illustrates the next step of the overall process depicted in FIG. 3, that of measuring calibration factors for the amplifiers at a particular gain level. The microprocessor 120 connects each amplifier 38a, 38b, and 38c to a common preamp, by means of the switches 36a, 36b, and 36c, respectively, as previously described. This allows the output of the amplifiers 38a, 38b, and 38c to be measured using a common preamp input signal, thus isolating the amplifiers for individual calibration. The microprocessor automatically calculates calibration factors for the individual amplifiers 38a, 38b, and 38c to be used in subsequent measurements.

Figure 3D:
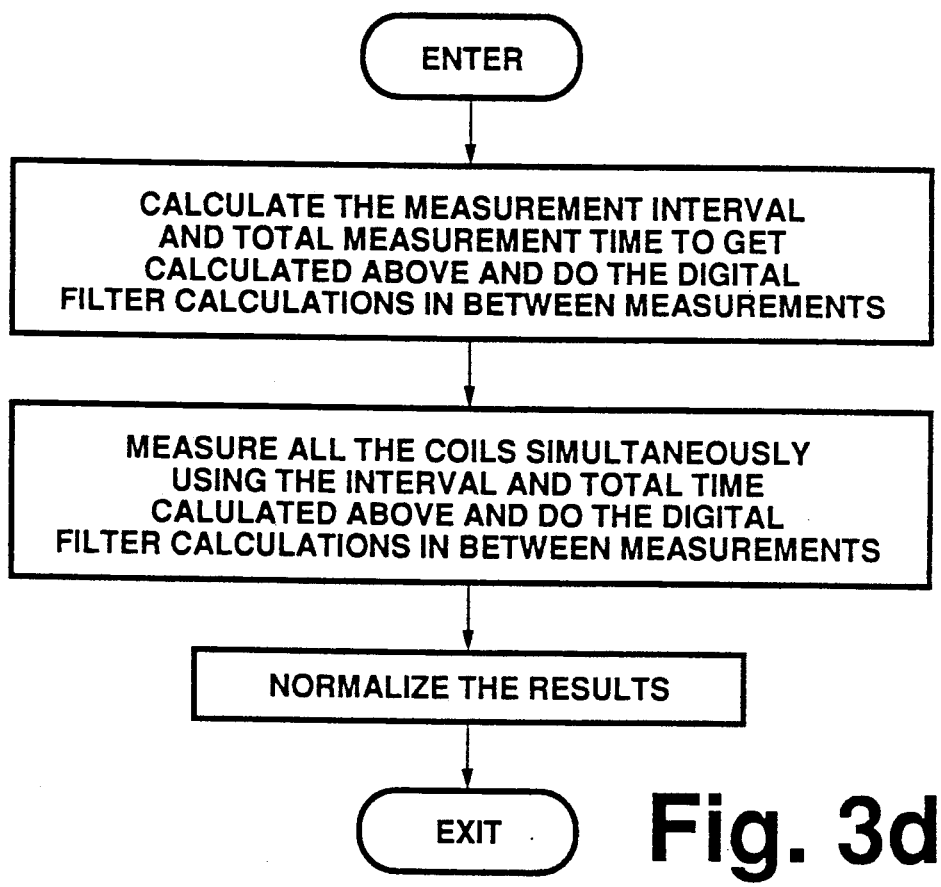
FIG. 3d is a flow chart elaborating the step depicted in block "d", shown in FIG. 3.

FIG. 3d illustrates the process employed by the microprocessor to measure signals received by receiving coils 30a, 30b, and 30c. The output level of the receiving coils 30a, 30b, and 30c is measured at a particular frequency, corresponding to the frequency of the input signal radiating from the transmitting source 50. In order to determine how fast to sample the wave form, the microprocessor calculates the measurement interval and total measurement time to get a desired analysis frequency, and a digital filter band width. The receiving coils 30a, 30b, and 30c are then measured simultaneously, using the previously calculated interval and total measurement time. Additionally, the microprocessor performs the digital filter calculations in between measurements, thus greatly increasing overall operating efficiency.

Referring to FIG. 3e, the microprocessor 120 recalls the last receiving coil measurements, as produced by the process illustrated in FIG. 3d. These last measurement figures are then adjusted to reflect the receiving coil calibration factors, as determined by the process illustrated in FIG. 3a, then adjusted to reflect the amplifier calibration factors, as determined by the process illustrated in FIG. 3c, and, finally, the resulting adjusted measurement figures are stored by the microprocessor for use in subsequent calculations.

These subsequent calculations are performed by the microprocessor 120 using a process as illustrated in FIG. 3f. The adjusted receiving coil measurements are recalled, and the microprocessor uses known mathematical relationships between the relevant variables to calculate depth and location figures. Referring back to FIG. 3, at this point, the display read-out on the operator panel 24 is updated to reflect the current measurement data, and the operator responds to any microprocessor commands, or sets any desired parameters and controls for further measurements.

As detailed in the foregoing description, there are a number of significant advantages to the design of the present apparatus. By addition of the calibrating coil 44 to the sensing apparatus, there is no longer a need to sacrifice coil sensitivity to small signals in order to provide stable, accurate coils and circuits. Furthermore, the accuracy of the sensor is impervious to external conditions such as temperature and length of use. That is, the calibrating operation automatically provides correction in the measurement readout for discrepancies in receiving coil sensitivity due to temperature and like factors, and, sensor accuracy is independent of use time because periodic manual re-calibration is unnecessary. Additionally, there is a reduction in the possibility of human error associated with manual calibration, as this has been replaced by closed-loop microprocessor-controlled continuous calibration. A further advantage to the design of the present apparatus is the use of only three receiving coils. By combining left and right receiving coils 30b and 30c to produce a single signal representative of the resultant field underneath the top receiving coil 30a, a fourth receiving coil becomes obsolete. This results in simplification of the internal sensor hardware design and manufacturing requirements, with an associated decrease in hardware production costs.

Whereas, the preferred embodiment of the present invention has been described above, it is contemplated that other alternatives and modifications may become apparent to those skilled in the art after having read the above disclosure. It is, therefore, intended that the appended claims be interpreted as covering all such alterations and modifications as fall within the true spirit and scope of the invention.

What is claimed is:

1. An apparatus for determining the distance to and location of a concealed conductive object radiating a first electromagnetic field induced by the application of an alternating current signal thereto, comprising:

first receptor means for receiving said first electromagnetic field and for providing a first output voltage proportional to the strength of the electromagnetic field at the position of said first receptor means;

second receptor means for receiving said first electromagnetic field and for providing a second output voltage proportional to the strength of the electromagnetic field at the position of said second receptor means;

third receptor means for receiving said first electromagnetic field and for providing a third output voltage proportional to the strength of the electromagnetic field at the position of said third receptor means;

support means for positioning said first, second and third signal receptor means at predetermined points relative to each other, said second and third receptor means being laterally spaced from each other and located beneath said first receptor means at points equidistant therefrom;

calibrating means supported by said support means and disposed in a predetermined spaced apart relationship to said first, second and third receptor means and having known relative coupling relationships with each of said receptor means, said calibrating means being operative to generate a second electromagnetic field for inducing calibrating voltage signals in each of said first, second and third receptor means;

computing means for calculating the relative sensitivities of each of said receptor means using the calibrating voltage signals, induced in each receptor means by said second electromagnetic field, and said known relative coupling relationships, said computing means further using said first, second and third output voltages and said relative sensitivities to calculate the distance to and location of said conductive object relative to said apparatus; and display means for indicating said calculated distance and location.

2. The apparatus of claim 1 wherein said computing means combines in vector fashion the signals received from said second and third receptor means and produces a signal which represents the electromagnetic field strength at a point midway between said second and third receptor means, and beneath said first receptor means.

3. An apparatus for determining the distance to and location of a concealed conductive object radiating first electromagnetic field induced by the application of an alternating current signal thereto, said apparatus comprising:

first receptor means for receiving said first electromagnetic field and for providing a first output voltage proportional to the strength of the electromagnetic field at the position of said first receptor means;

second receptor means for receiving said first electromagnetic field and for providing second output voltages proportional to the strength of the first electromagnetic field at positions spaced vertically apart from said first receptor means;

support means for positioning said first and second signal receptor means at predetermined points relative to each other;

calibrating means disposed in spaced apart relationship to said first and second receptor means and operative to generate a second electromagnetic field for inducing calibrating voltage signals in each of said first and second receptor means;

computing means for calculating the relative sensitivities of each of said first and second receptor means using each said calibrating voltage signal induced by said calibrating means, and said known relative coupling relationships, said computing means further using said first and second output voltages and said relative sensitivities to calculate the vertical distance from said apparatus to said conductive object; and display means for indicating said calculated distance.

4. The apparatus of claim 3 wherein said second receptor means includes:

first coil means for receiving said first electromagnetic field and for providing a first one of said second output voltages proportional to the strength of the electromagnetic field at the position of said first coil means; and second coil means for receiving said first electromagnetic field and for providing a second one of said second output voltages proportional to the strength of the electromagnetic field at the position of said second coil means;

said first and second coil means being positioned in spaced apart relationship by said support means such that the midpoint of a first line passing through said first and second coil means is bisected by a second line normal thereto and passing through said first receptor means;

said computing means using said first one and said second one of said second output voltages and said relative sensitivities to calculate the horizontal location of said conductive object relative to said apparatus; and wherein said display means further indicates said calculated horizontal location.

5. The apparatus of claim 4 wherein each computing means combines in vector fashion the second voltages received from said first and second coil means.

6. The apparatus of claim 1 or 2 wherein said support means is formed by an upper casing and a lower casing pivotably joined together such that said upper casing may be rotated 90 degrees with respect to said lower casing from a storage position to an operational position, said upper casing including an elongated handle the length of which lies in a first plane when said upper casing is in said storage position and lies in a second plane generally orthogonal to said first plane when said upper casing is in said operational position, said first, second and third receptor means being carried by said lower casing and positioned in a triangular array with said first receptor means being positioned proximate the junction of said upper casing to said lower casing, said triangular array lying within said first plane such that when said handle is in said operational position its length extends normal thereto.

7. The apparatus of claim 1, 2, 3, 4 or 5 further comprising:

preamplification means coupled to each said receptor means for providing preamplification of output signals received from each said receptor means at predetermined gain levels;

amplification means coupled to each said preamplification means for providing amplification of the output signals received from said preamplification means; and switching means for alternatively connecting each said amplification means to respective ones of said preamplification means or to a common one of said preamplification means.

8. The apparatus of claim 7 wherein the gain of each said preamplification means is selectable at either 0 dB or 54 dB, and the gain of each said amplification means is selectable in 6 dB steps up to a maximum of 54 dB, whereby a total preamplification and amplification gain range of 0 dB to 108 dB is available.

9. The apparatus of claim 1, 2, 3, 4 or 5 further comprising:

tuning means coupled to each said receptor means for enabling the selective tuning of each said receptor means to a desired frequency band.

* * * * *